United States Patent
Morita

(10) Patent No.: US 9,812,991 B2
(45) Date of Patent: Nov. 7, 2017

(54) INSULATING STRUCTURE FOR POWER CONVERSION DEVICE

(71) Applicant: MEIDENSHA CORPORATION, Tokyo (JP)

(72) Inventor: Kazunori Morita, Mishima (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 15/106,947

(22) PCT Filed: Nov. 13, 2014

(86) PCT No.: PCT/JP2014/080020
§ 371 (c)(1),
(2) Date: Jun. 21, 2016

(87) PCT Pub. No.: WO2015/098336
PCT Pub. Date: Jul. 2, 2015

(65) Prior Publication Data
US 2017/0237361 A1 Aug. 17, 2017

(30) Foreign Application Priority Data

Dec. 26, 2013 (JP) .................................. 2013-268570

(51) Int. Cl.
*H02P 1/00* (2006.01)
*H02M 7/539* (2006.01)
(Continued)

(52) U.S. Cl.
CPC ........... *H02M 7/539* (2013.01); *H02M 1/084* (2013.01); *H03K 17/691* (2013.01); *H03K 17/78* (2013.01)

(58) Field of Classification Search
CPC ..... H02K 16/00; B60L 8/006; B60L 15/2009; H02P 27/085; H02J 50/00; Y02B 70/149; B60K 7/0007
(Continued)

(56) References Cited

U.S. PATENT DOCUMENTS 6,054,818 A * 4/2000 Tabata ................. B60K 7/0007
318/139
8,145,020 B2 3/2012 Fujimoto
(Continued)

FOREIGN PATENT DOCUMENTS

DE 10 2007 029 349 A1 8/2008
GB 1 540 697 A 2/1979
(Continued)

OTHER PUBLICATIONS

R. Steiner et al., Contactless Energy Transmission for an Isolated 100W Gate Driver Supply of a Medium Voltage Converter, Proceedings of the 35th Annual Conference of the IEEE Industrial Electronics Society (IECON 2009), Nov. 2009, pp. 302-307.
(Continued)

*Primary Examiner* — Rajnikant Patel
(74) *Attorney, Agent, or Firm* — Foley & Lardner LLP

(57) ABSTRACT

Due to increase of demand for safety of device, reinforcement of insulation of exposed conductive parts is required also in power conversion device. Relay unit having optical transmission unit, signal processing unit and power generating unit is provided between control circuit unit and gate drive circuit unit which form control device for an inverter. A gate signal generated in the control circuit unit is inputted into the signal processing unit of the relay unit through the optical transmission unit, and is outputted to the gate drive circuit unit from the signal processing unit through the optical transmission unit. Further, AC power is supplied to
(Continued)

CONFIGURATION OF CONTROL DEVICE OF THE PRESENT INVENTION the power generating unit of the relay unit from a control device low-voltage AC power source through high-withstand voltage transformer. AC power is supplied to the gate drive circuit unit from the power generating unit of the relay unit through high-withstand voltage transformer.

3 Claims, 3 Drawing Sheets

(51) Int. Cl.
*H02M 1/084* (2006.01)
*H03K 17/691* (2006.01)
*H03K 17/78* (2006.01)

(58) Field of Classification Search
USPC ........ 318/49, 139, 768, 801; 363/26, 37–40, 363/55
See application file for complete search history.

(56) References Cited

U.S. PATENT DOCUMENTS

| | | | |
|---|---|---|---|
| 8,269,594 B2 | 9/2012 | Yoshimura et al. | |
| 8,305,027 B2 | 11/2012 | Shibuya | |
| 8,581,437 B2 | 11/2013 | Delforge | |
| 9,007,002 B2* | 4/2015 | Niizuma | H02P 27/085 318/139 |
| 9,509,198 B2* | 11/2016 | Jahshan | H02P 23/00 |
| 2014/0098929 A1 | 4/2014 | Delforge | |

FOREIGN PATENT DOCUMENTS

| | | |
|---|---|---|
| GB | 2 137 854 A | 10/1984 |
| JP | 2003-69406 A | 3/2003 |
| JP | 2006-081232 A | 3/2006 |
| JP | 2006-109686 A | 4/2006 |
| JP | 2008-043189 A | 2/2008 |
| JP | 4055115 B2 | 3/2008 |
| JP | 2008-270490 A | 11/2008 |
| JP | 2008-312342 A | 12/2008 |
| JP | 2010-515407 A | 5/2010 |
| WO | WO 2008/142796 A1 | 11/2008 |

OTHER PUBLICATIONS

Japanese Office Action, dated Jun. 20, 2017, 3 pages.
M.A. Derooij et al., Development of a 1MHz MOSFET Gate-Driver for Integrated Converters, IEEE , Service CE, 37$^{th}$ IAS Annual Meeting, Oct. 13, 2002, pp. 2622-2629.
Extended European Search Report, dated Jul. 11, 2017, 9 pages.

* cited by examiner

FIG. 1  CONFIGURATION OF CONTROL DEVICE OF THE PRESENT INVENTION
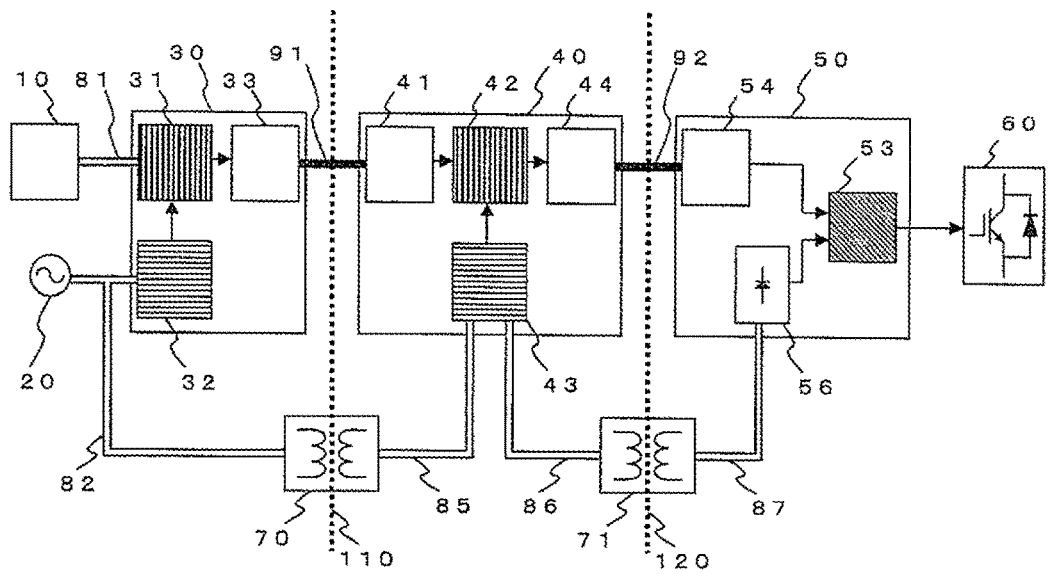
FIG. 2  CONFIGURATION OF CONTROL DEVICE OF THE PRESENT INVENTION
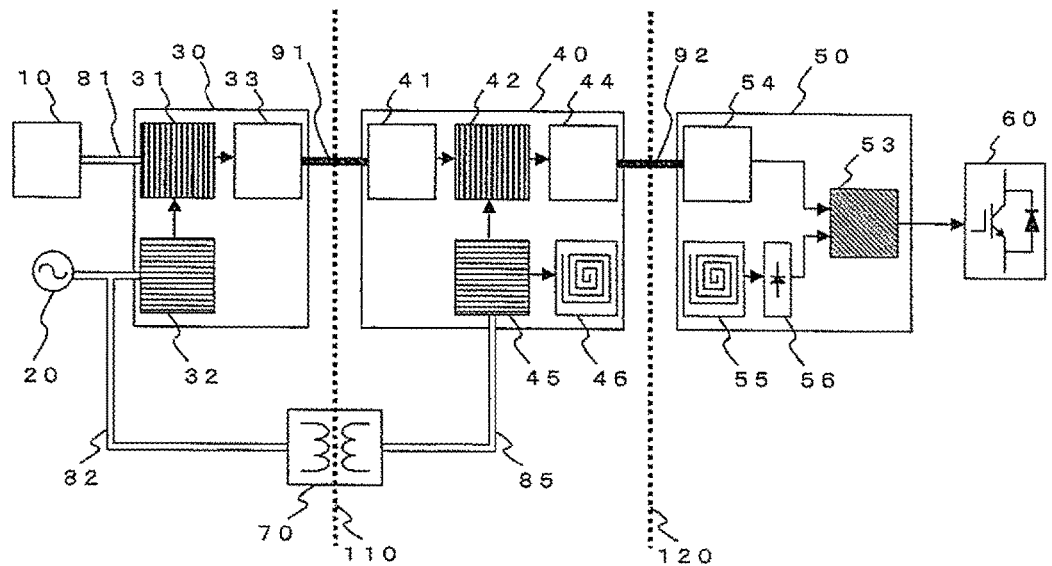

FIG. 3 CONFIGURATION OF CONTROL DEVICE OF THE PRESENT INVENTION
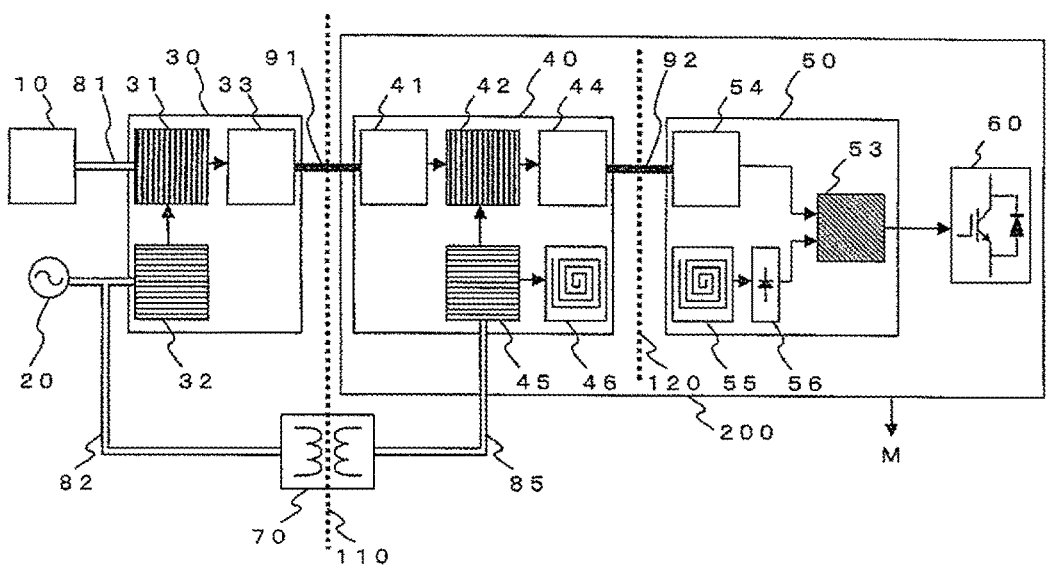
FIG. 4 CONFIGURATION OF MAIN CIRCUIT OF THREE-PHASE INVERTER
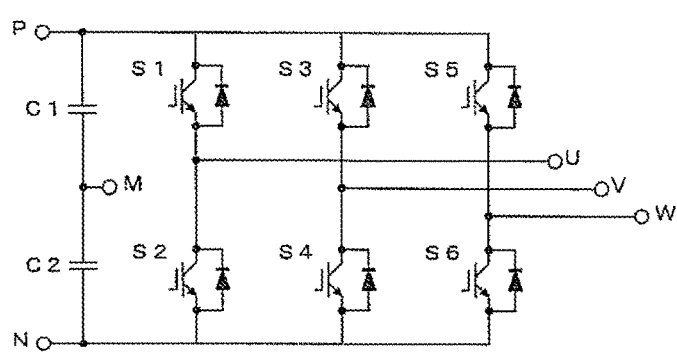

FIG. 5  CONFIGURATION OF MAIN CIRCUIT OF THREE-PHASE INVERTER
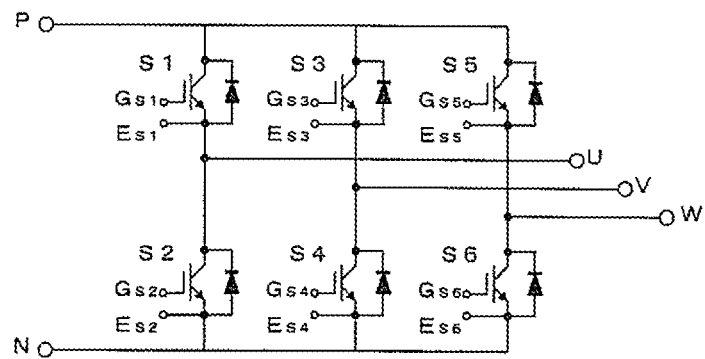
FIG. 6  CONFIGURATION OF CONTROL DEVICE OF RELATED ART
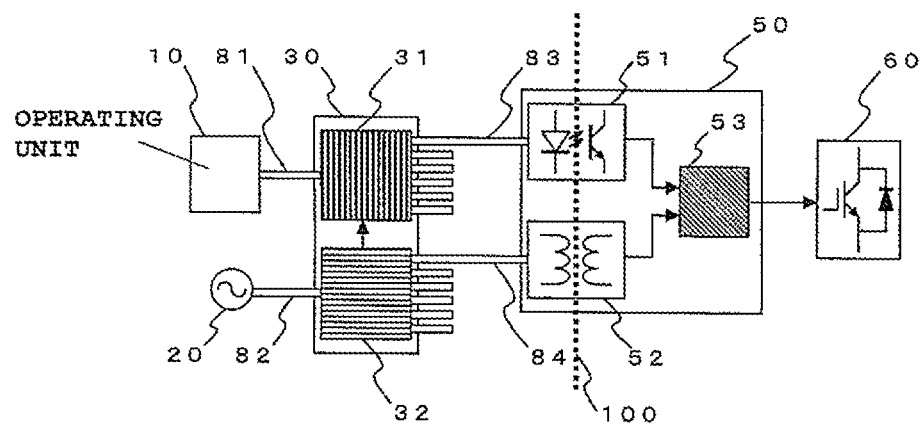

INSULATING STRUCTURE FOR POWER CONVERSION DEVICE

TECHNICAL FIELD

The present invention relates to a power conversion device, and more particularly to an insulating structure for the power conversion device whose input voltage is relatively high.

BACKGROUND ART

FIG. 5 shows a configuration of a main circuit of a general three-phase inverter. The circuit is configured by six semiconductor switching devices. As the semiconductor switching device used, it could be an IGBT (insulated-gate bipolar transistor), an FET and so on. The IGBT, which is often used for a large-capacity power conversion device, is taken as an example here, and will be explained below. Each embodiment described later is therefore not limited to the IGBT.

In the three-phase inverter shown in FIG. 5, ON/OFF gate signals of IGBTs S1 to S6 are generated by a control circuit unit and the IGBTs S1 to S6 are controlled by a gate drive circuit unit, thereby obtaining a desired AC voltage output. Each gate signal for ON/OFF of the IGBT is determined according to a voltage between a gate and an emitter of the IGBT. For instance, the ON/OFF gate signal of S1 is determined according to a voltage between a Gs1 terminal and an Es1 terminal, and the ON/OFF gate signal of S2, which is connected to S1 in series, is determined according to a voltage between a Gs2 terminal and an Es2 terminal.

An electric potential of the Es2 terminal is always an electric potential of an N-terminal of a DC unit, whereas an electric potential of the Es1 terminal is an electric potential of a P-terminal of the DC unit when S1 is ON, and the electric potential of the Es1 terminal is the electric potential of the N-terminal of the DC unit when S2 is ON. Since an emitter potential of each IGBT is different in this manner, it is required that each gate-emitter voltage should be an insulated voltage.

FIG. 6 is a partial view of configuration of a control device for a three-phase inverter disclosed in Patent Document 1. A voltage command value, a frequency command-value etc. set in an operating unit 10 by an operator are inputted into a gate signal generating unit 31 in a control circuit unit 30. ON/OFF gate signals of S1 to S6 generated in the respective gate signal generating units 31 are inputted into respective gate drive circuit units 50 which are insulated or isolated from each other, and are applied to S1 to S6 as an insulated or isolated gate-emitter voltage.

The gate signal inputted from the gate signal generating unit 31 into the gate drive circuit unit 50 is insulated or isolated by a photocoupler 51. Further, power in the gate drive circuit unit 50, which is supplied from a power generating unit 32 in the control circuit unit 30, is insulated or isolated by a transformer 52. In this manner, in the general three-phase inverter, the control circuit unit 30 and the gate drive circuit unit 50 are insulated or isolated by an insulation boundary 100.

CITATION LIST

Patent Document

Patent Document 1: Japanese Patent Publication No. 4055115

Non-Patent Document

Non-Patent Document 1: R. Steiner, P. K. Steimer, F. Krisrner, J. W. Kolar, Contactless Energy Transmission for an Isolated 100 W Gate Driver Supply of a Medium Voltage Converter, Proceedings of the 35th Annual Conference of the IEEE Industrial Electronics Society (IECON 2009), Porto, Portugal, Nov. 3-5, 2009, pp. 302-307

SUMMARY OF THE INVENTION

In recent years, public demand for safety has increased, and the power conversion device is also required to comply with safety standards such as IEC-61800-5-1. According to IEC-61800-5-1, for a circuit of a decisive voltage class D, protection bonding (connection to the earth) of exposed conductive parts or double insulation or reinforced insulation is required.

A decisive voltage class is determined by working voltage in the circuit. Then, a main circuit unit of an inverter whose input and output voltage is 1 kV or greater corresponds to the decisive voltage class D.

Therefore, the protection bonding or the double insulation or the reinforced insulation is required between the exposed conductive parts in e.g. the operating unit which a user of the power conversion device has a possibility of touching and the circuit of the decisive voltage class D. Since the command etc. are inputted by an electric signal in the circuit of the operating unit, the protection bonding is impossible.

In a case of the configuration of the three-phase inverter as shown in FIGS. 5 and 6, an insulation boundary between the operating unit 10 which the user of the power conversion device has a possibility of touching and an IGBT 60 that is a main circuit unit of the inverter is only one place of the insulation boundary 100. If this insulation boundary 100 is strengthened or reinforced, the power conversion device can comply with IEC-61800-5-1. However, a large creepage distance and a large space distance are necessary for the reinforced insulation, and this causes a problem of upsizing the device.

An object of the present invention is to provide a power conversion device having a double insulation structure and a small-sized insulation structure for an inverter whose input and output voltage is 1 kV or greater, which complies with IEC-61800-5-1.

The present invention comprises: a control device of an inverter configured by a semiconductor switching device, the control device having a control circuit unit that generates a gate signal; and a gate drive circuit unit that inputs the generated gate signal through an optical transmission unit and controls the semiconductor switching device; and a relay unit provided between the control circuit unit and the gate drive circuit unit, the relay unit having an optical transmission unit; a signal processing unit; and a power generating unit. The gate signal generated by the control circuit unit is inputted into the signal processing unit of the relay unit through the optical transmission unit, and an output from the signal processing unit is inputted into the gate drive circuit unit through the optical transmission unit. AC power is supplied to the power generating unit of the relay unit from a control device AC power source through a transformer, and the AC power is supplied to the gate drive circuit unit from the power generating unit of the relay unit through a different transformer.

Further, in the present invention, a power transmission coil is provided in the relay unit, a power receiving coil is provided in the gate drive circuit unit, and a high-frequency AC power generated by the power generating unit of the relay unit is transmitted to the power receiving coil of the gate drive circuit unit through the power transmission coil.

Moreover, in the present invention, the relay unit, the gate drive circuit unit and the semiconductor switching device are accommodated in an accommodating case that is made of conductive material, and the accommodating case is connected to a middle electric potential terminal of voltage of an inverter main circuit.

BRIEF DESCRIPTION OF THE DRAWINGS

FIG. 1 is a drawing of a configuration of an inverter control device, showing an embodiment of the present invention.

FIG. 2 is a drawing of a configuration of the inverter control device, showing the other embodiment of the present invention.

FIG. 3 is a drawing of a configuration of the inverter control device, showing the other embodiment of the present invention.

FIG. 4 is a drawing of a configuration of a main circuit of a three-phase inverter.

FIG. 5 is a drawing of a configuration of a main circuit of a three-phase inverter.

FIG. 6 is a drawing of a configuration of a related art inverter control device.

EMBODIMENTS FOR CARRYING OUT THE INVENTION

In the present invention, a relay unit having an optical transmission unit, a signal processing unit and a power generating unit is provided between a control circuit unit and a gate drive circuit unit which form a control device for an inverter. A gate signal generated in the control circuit unit is inputted into the signal processing unit of the relay unit through the optical transmission unit, and is outputted to the gate drive circuit unit from the signal processing unit through the optical transmission unit. Further, AC power is supplied to the power generating unit of the relay unit from a control device low-voltage AC power source through a high-withstand voltage transformer. Also, AC power is supplied to the gate drive circuit unit from the power generating unit of the relay unit through a high-withstand voltage transformer. The present invention configured as above will be explained below.

FIG. 1 shows a configuration of a control device of a first embodiment of the present invention. The same element or component as that in FIG. 6, or a corresponding element or component, is denoted by the same reference sign. As a configuration of an inverter, a three-phase inverter shown in FIG. 5 is employed. The three-phase inverter is controlled by determining and controlling ON/OFF gate signals of IGBTs S1 to S6 in a gate signal generating unit 31 in a control circuit unit 30, thereby obtaining an AC voltage output according to a voltage command value, a frequency command value etc. set in an operating unit 10 by an operator.

The voltage command value, the frequency command value etc. set in the operating unit 10 are inputted into the gate signal generating unit 31 in the control circuit unit 30. The ON/OFF gate signals of IGBTs S1 to S6, generated by the gate signal generating unit 31, are converted from an electric signal into an optical signal by an optical transmitter 33 that is an optical transmission unit, and are inputted into a relay unit 40. Power for driving the gate signal generating unit 31 is supplied from a control device AC power source 20 through a power generating unit 32.

The gate signal transmitted from the control circuit unit 30 is inputted into an optical receiver 41 in the relay unit 40 through an optical fiber 91, and is converted again from the optical signal into the electric signal, then is inputted into a signal processing unit 42. The signal processing unit 42 has a function of carrying out a process that sets the gate signal to OFF when an abnormal condition occurs in the relay unit 40. The gate signal outputted from the signal processing unit 42 is converted again from the electric signal into the optical signal by an optical transmitter 44, and is inputted into a gate drive circuit unit 50. Power insulated or isolated by a high-withstand voltage transformer 70 is inputted from a power generating unit 43 in the relay unit 40, and is supplied to the signal processing unit 42. Further, a part of the power supplied from the transformer 70 is inputted into a high-withstand voltage transformer 71. As the high-withstand voltage transformer 70 and the high-withstand voltage transformer 71, a transformer having a withstand that can withstand an electric potential difference generated between primary and secondary circuits of the transformer is used.

The gate signal transmitted from the relay unit 40 is inputted into an optical receiver 54 in the gate drive circuit unit 50 through an optical fiber 92, and is converted again from the optical signal into the electric signal, then is inputted into a gate driver 53. The gate driver 53 controls a gate-emitter voltage of an IGBT 60. Power required for operation of the gate driver 53 is supplied from the transformer 71 through a rectifier 56.

FIG. 1 shows only a control configuration for one IGBT of the six IGBTs that form the three-phase inverter. By connecting the control circuit unit 30, the relay unit 40 and the gate drive circuit unit 50 for each of the other IGBTs in the same manner, the IGBTs S1 to S6 shown in FIG. 5 can all be controlled. Further, instead of the optical fibers 91 and 92 as the optical transmission unit, a photocoupler as shown in FIG. 6 could be used.

In the power conversion device shown in FIG. 1, insulation or isolation is established by two places of an insulation boundary 110 and an insulation boundary 120. That is, the gate signal is insulated between the control circuit unit 30 and the relay unit 40 by the optical fiber 91. The control power is insulated by the transformer 70. The gate signal is insulated between the relay unit 40 and the gate drive circuit unit 50 by the optical fiber 92. And, the control power is insulated by the transformer 71.

According to IEC-61800-5-1, for a circuit of a decisive voltage class D, protection bonding (connection to the earth) of exposed conductive parts or double insulation or reinforced insulation from other circuits of the decisive voltage class D is required. A decisive voltage class is determined by working voltage in the circuit. Then, a main circuit unit of an inverter whose input and output voltage is 1 kV or greater corresponds to the decisive voltage class D. With the insulation configuration of FIG. 1, for the inverter whose input and output voltage is 1 kV or greater, the operating unit 10 is insulated or isolated from the main circuit unit of the IGBT 60 which corresponds to the decisive voltage class D by the double insulation. This configuration can therefore comply with IEC-61800-5-1.

According to the present embodiment, since a creepage distance and a space distance can be easily shortened, it is possible to reduce a size of the insulation configuration for the device without establishing the reinforced insulation for each of control parts.

FIG. 2 shows a second embodiment. A different point from FIG. 1 is that instead of the transformer 71, a power transmission coil 46 and a power receiving coil 55 are provided to receive and supply the control power between the relay unit 40 and the gate drive circuit unit 50.

That is, power insulated by the transformer 70 is inputted into a power generating unit 45 in the relay unit 40, and is supplied to the signal processing unit 42. At the same time, a high-frequency AC power is generated in the power generating unit 45, and the generated high-frequency AC power is inputted into the power transmission coil 46, then the power is transmitted to the power receiving coil 55 in the gate drive circuit unit 50 through the power transmission coil 46 in a non-contact manner.

AC power received by the power receiving coil 55 is converted to DC power by the rectifier 56, as a control power (a control power supply) for the gate driver 53. Here, regarding the non-contact power supply between the power transmission coil 46 and the power receiving coil 55, it can be realized by a technique disclosed in, for instance, Non-Patent Document 1. The other operations are same as those of FIG. 1.

In general, as compared with a low-withstand voltage transformer, size and weight of a high-withstand voltage transformer are both great, and cost of the high-withstand voltage transformer is also high. Therefore, according to the present embodiment, the insulation configuration that can achieve reduction in the size and the cost more than the embodiment of FIG. 1 can be obtained.

FIG. 3 is a block diagram showing a third embodiment. In a case where the high-frequency AC power is generated in the relay unit 40 and is transmitted to the gate drive circuit unit 50 in the non-contact manner as shown in FIG. 2, a part of the high-frequency AC power leaks to surroundings as an electromagnetic fieldnoise. Further, noises are also generated in the IGBT 60 due to a switching operation of large power. If these noises enter the control circuit unit 30, there is a possibility that a malfunction will occur in the circuit and the power conversion device itself will malfunction.

The embodiment shown in FIG. 3 is an embodiment that prevents the generated noises from entering the control circuit unit 30. In order to prevent the generated noises from entering the control circuit unit 30, the relay unit 40, the gate drive circuit unit 50 and the IGBT 60 are accommodated by and in an accommodating case 200 that is made of conductive material. The leak, from the accommodating case 200, of the electromagnetic field noise generated by the power transmission coil 46 etc. is then prevented. In addition, by connecting this accommodating case 200 to a middle electric potential terminal M of voltage of the inverter main circuit shown in FIG. 4, further reduction of the insulation configuration (insulation structure) of the device is achieved.

That is, by accommodating the relay unit 40, the gate drive circuit unit 50 and the IGBT 60 by and in the accommodating case 200, since the control circuit unit 30 can be prevented from being exposed to the electromagnetic field noise, noise measures for the control circuit unit 30 are not necessary. Further, by connecting this accommodating case 200 to the terminal M that is a middle electric potential between terminals P and N of the inverter main circuit, it is possible to shorten a space distance between the accommodating case 200 and the inverter main circuit, then the reduction of the insulation configuration (the insulation structure) of the device can be realized. Here, C1 and C2 in FIG. 4 are capacitors.

If the accommodating case 200 is earthed and an electric potential of the N terminal is an earth potential, it is required for a space distance between the P terminal and the accommodating case 200 when arranging the accommodating case 200 to secure a permissible space distance for voltage between the terminals P and N of the main circuit. In this respect, by connecting the accommodating case 200 to the middle electric potential terminal M like the third embodiment, an arrangement distance of the accommodating case 200 is not limited as long as a permissible space distance for half of voltage between the terminals P and N is secured. With this, it is possible to prevent size of the device from becoming large.

Further, in the present embodiment, by reducing each function part accommodated in the accommodating case 200 to a minimum, reduction in size of the device is realized. That is, only the relay unit 40, the gate drive circuit unit 50 and the IGBT 60, which are required to secure the space distance, are accommodated in the accommodating case 200, while the operating unit 10, the control circuit unit 30 and the transformer 70, which operate only a low-voltage and are not required to secure the space distance, are disposed outside the accommodating case 200. With this arrangement, degree of freedom of the arrangement of the control circuit unit 30 and the transformer 70 is increased, and reduction in overall size of the device can be achieved.

Here, also in the device shown in FIG. 1, by accommodating only the relay unit 40, the gate drive circuit unit 50 and the IGBT 60 in the accommodating case 200, the same effects as those of the third embodiment can be obtained.

As explained above, according to the present invention, the power conversion device can comply with safety standards provided by the IEC-61800-5-1 while achieving the reduction in the size and the cost of the device without requiring providing the reinforced insulation. Further, by accommodating the relay unit, the gate drive circuit unit and the semiconductor switching device in the accommodating case made of conductive material and connecting the accommodating case to the middle electric potential point of the voltage of the main circuit, noise measures of the control device can be lightened, and also the permissible space distance can be shortened. Overall size of the device can be therefore reduced.

The invention claimed is:

1. An insulating structure for a power conversion device comprising:
    a control device of an inverter configured by a semiconductor switching device, the control device having
        a control circuit unit that generates a gate signal; and
        a gate drive circuit unit that inputs the generated gate signal through an optical transmission unit and controls the semiconductor switching device; and
    a relay unit provided between the control circuit unit and the gate drive circuit unit, the relay unit having
        an optical transmission unit;
        a signal processing unit; and
        a power generating unit, and wherein
        the gate signal generated by the control circuit unit is inputted into the signal processing unit of the relay unit through the optical transmission unit, and an output from the signal processing unit is inputted into the gate drive circuit unit through the optical transmission unit, and
    AC power being supplied to the power generating unit of the relay unit from a control device AC power source through a transformer, and the AC power being supplied to the gate drive circuit unit from the power generating unit of the relay unit through a different transformer.

2. The insulating structure for the power conversion device, as claimed in claim 1, wherein:
   a power transmission coil is provided in the relay unit, a power receiving coil is provided in the gate drive circuit unit, and a high-frequency AC power generated by the power generating unit of the relay unit is transmitted to the power receiving coil of the gate drive circuit unit through the power transmission coil.

3. The insulating structure for the power conversion device, as claimed in claim 1, wherein:
   the relay unit, the gate drive circuit unit and the semiconductor switching device are accommodated in an accommodating case that is made of conductive material, and the accommodating case is connected to a middle electric potential terminal of voltage of an inverter main circuit.

* * * * *